(12) United States Patent
Cheng et al.

(10) Patent No.: US 11,662,631 B2
(45) Date of Patent: May 30, 2023

(54) DISPLAY SUBSTRATE AND DISPLAY DEVICE

(71) Applicants: Beijing BOE Technology Development Co., Ltd., Beijing (CN); BOE TECHNOLOGY GROUP CO., LTD., Beijing (CN)

(72) Inventors: Hongfei Cheng, Beijing (CN); Hui Li, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/280,896

(22) PCT Filed: May 20, 2020

(86) PCT No.: PCT/CN2020/091280
§ 371 (c)(1),
(2) Date: Mar. 28, 2021

(87) PCT Pub. No.: WO2020/238722
PCT Pub. Date: Dec. 3, 2020

(65) Prior Publication Data
US 2021/0405489 A1   Dec. 30, 2021

(30) Foreign Application Priority Data

May 31, 2019   (CN) .......................... 201920813461.9

(51) Int. Cl.
*G02F 1/1345* (2006.01)
*G02F 1/1362* (2006.01)
(Continued)

(52) U.S. Cl.
CPC ........ *G02F 1/1345* (2013.01); *G02F 1/13452* (2013.01); *G02F 1/136204* (2013.01);
(Continued)

(58) Field of Classification Search
CPC ............. G02F 1/136204; G02F 1/1345; G02F 1/13452
See application file for complete search history.

(56) References Cited

U.S. PATENT DOCUMENTS 8,330,893 B2    12/2012  Satoh
2006/0181500 A1   8/2006  Murade
(Continued)

FOREIGN PATENT DOCUMENTS

CN       1821841 A      8/2006
CN     101568950 A     10/2009
(Continued)

*Primary Examiner* — Dung T Nguyen
(74) *Attorney, Agent, or Firm* — Houtteman Law LLC

(57) ABSTRACT

The present disclosure provides a display substrate and a display device. The display substrate includes a base substrate, and a transistor, an anti-static wire, a first anti-static resistor and a first ground bonding pad on the base substrate, wherein a first terminal of the first anti-static resistor is electrically connected to a first end of the anti-static wire, a second terminal of the first anti-static resistor is electrically connected to the first ground bonding pad, and the first anti-static resistor is at a different layer from a layer at which the anti-static wire is located and a layer at which the first ground bonding pad is located, and is at a same layer as an active layer of the resistor.

16 Claims, 2 Drawing Sheets

(51) Int. Cl.
   *H01L 27/02*     (2006.01)
   *H01L 27/32*     (2006.01)

(52) U.S. Cl.
   CPC .. *G02F 1/136254* (2021.01); *G02F 1/136286*
         (2013.01); *H01L 27/0288* (2013.01); *H01L*
                                       *27/3276* (2013.01)

(56) References Cited

U.S. PATENT DOCUMENTS

2008/0165301  A1*  7/2008  Chang ................ G02F 1/13452
                                                        349/40
2019/0006442  A1   1/2019  Byun et al.

FOREIGN PATENT DOCUMENTS

| CN | 205608688 U | 9/2016 |
| CN | 107219699 A | 9/2017 |
| CN | 209592036 U | 11/2019 |

\* cited by examiner

— continued —

DISPLAY SUBSTRATE AND DISPLAY DEVICE

CROSS REFERENCE TO RELATED APPLICATIONS

The present application is a National Phase Application filed under 35 U.S.C. 371 as a national stage of PCT/CN2020/091280, filed on May 20, 2020, an application claiming priority from a Chinese patent application No. 201920813461.9, filed on May 31, 2019 to National Intellectual Property Administration, PRC, the disclosure of which is incorporated herein by reference in its entirety.

TECHNICAL FIELD

The present disclosure relates to the field of display technology, in particular, to a display substrate and a display device.

BACKGROUND

A display substrate, such as an organic light emitting diode (OLED) display substrate, a liquid crystal display substrate or the like, is generally divided into a display region and a non-display region surrounding an outer boundary of the display region. A plurality of sub-pixels each including one or more transistors is provided in the display region. Typically, a plurality of gate lines extending in a row direction and a plurality of data lines extending in a column direction are also provided in the display substrate.

SUMMARY

An aspect of the present disclosure provides a display substrate including a base substrate, and a transistor, an anti-static wire, a first anti-static resistor, and a first ground bonding pad on the base substrate, wherein a first terminal of the first anti-static resistor is electrically connected to a first end of the anti-static wire, and a second terminal of the first anti-static resistor is electrically connected to the first ground bonding pad, and the first anti-static resistor is at a different layer from a layer at which the anti-static wire is located and a layer at which the first ground bonding pad is located, and is at a same layer as an active layer of the transistor.

According to an embodiment of the present disclosure, the display substrate further includes a second anti-static resistor and a second ground bonding pad, a first terminal of the second anti-static resistor is electrically connected to a second end of the anti-static wire, and a second terminal of the second anti-static resistor is electrically connected to the second ground bonding pad.

According to an embodiment of the present disclosure, the display substrate further includes an anti-static electrode and a common electrode bonding pad which is configured to receive a common voltage, an orthographic projection of the anti-static electrode on the base substrate overlaps an orthographic projection of the first anti-static resistor on the base substrate, the anti-static electrode and the first anti-static resistor are insulated and spaced apart from each other in a thickness direction of the display substrate, and the anti-static electrode is electrically connected to the common electrode bonding pad.

According to an embodiment of the present disclosure, the display substrate is divided into a display region and a non-display region surrounding boundaries of the display region, the display region includes the transistor, the non-display region includes the anti-static wire, the first anti-static resistor, the anti-static electrode and a plurality of bonding pads, and the plurality of bonding pads at least includes the first ground bonding pad and the common electrode bonding pad.

According to an embodiment of the present disclosure, the anti-static wire surrounds the boundaries of the display region except for a boundary facing a region in which the plurality of bonding pads are located.

According to an embodiment of the present disclosure, the display substrate further includes a signal line, the anti-static wire is at a same layer as at least a portion of the signal line.

According to an embodiment of the present disclosure, the signal line includes at least one of a gate line, a data line, a ground line and a common electrode line.

According to an embodiment of the present disclosure, the transistor includes the active layer, a gate insulating layer covering the active layer, a gate electrode on a side of the gate insulating layer facing away from the base substrate, an interlayer dielectric layer covering the gate electrode, and a source electrode and a drain electrode on a side of the interlayer dielectric layer facing away from the base substrate, and each of the source electrode and the drain electrode is connected to the active layer through a via hole penetrating through the interlayer dielectric layer and the gate insulating layer.

According to an embodiment of the present disclosure, the first anti-static resistor is between the base substrate and the gate insulating layer, the first terminal of the first anti-static resistor is electrically connected to the first end of the anti-static wire through a first via hole penetrating through the gate insulating layer, and the second terminal of the first anti-static resistor is electrically connected to the first ground bonding pad through a second via hole penetrating through the gate insulating layer.

According to an embodiment of the present disclosure, the display region has a rectangular shape, the anti-static wire is disposed along three sides of the rectangular shape, and the first anti-static resistor is disposed along a remaining side of the rectangular shape.

According to an embodiment of the present disclosure, at least a portion of the orthographic projection of the first anti-static resistor on the base substrate has a first square waveform shape, at least a portion of the orthographic projection of the anti-static electrode on the base substrate has a second square waveform shape, and the first square waveform shape has an orientation which is different from an orientation of the second square waveform shape.

According to an embodiment of the present disclosure, the transistor further includes a passivation layer covering the source electrode and the drain electrode, and at least one of a pixel electrode on a side of the passivation layer facing away from the base substrate and a common electrode on the side of the passivation layer facing away from the base substrate.

According to an embodiment of the present disclosure, the anti-static electrode is on the passivation layer, and is electrically connected to the common electrode bonding pad through a third via hole penetrating through the passivation layer and the interlayer dielectric layer.

According to an embodiment of the present disclosure, the anti-static electrode is at a same layer as at least one of the pixel electrode and the common electrode.

According to an embodiment of the present disclosure, the first anti-static resistor is formed of doped polysilicon.

According to an embodiment of the present disclosure, the anti-static electrode is formed of indium tin oxide.

Another aspect of the present disclosure provides a display device including the display substrate as described above.

DETAILED DESCRIPTION

In order that those skilled in the art will better understand technical solutions of the present disclosure, the following detailed description is given with reference to accompanying drawings and specific embodiments.

In the present disclosure, two structures being "at a same layer" means that they are formed in a same process using a same material and are therefore located at a same layer in view of stacking relationship, but do not mean that they are equidistant from a substrate or that the layers between one of the two structures and the substrate are the same as those between the other one of the two structures and the substrate. Rather, two structures being "at different layers" means that the two structures are located at different layers in view of stacking relationship.

A display substrate may generally include an array substrate. Static electricity is likely to be accumulated in a manufacturing process of the display substrate, and easily causes damage to the display substrate. A part of a non-display region of the display substrate is generally used for bonding with a structure such as a flexible circuit board. Bare electrodes, also referred to as bonding pads, are disposed in the part of the non-display region and electrically connected to peripheral structures such as a graphics processor, a mobile phone motherboard, etc. through the flexible circuit board. The bare electrodes typically include a ground bonding pad that is typically connected to, for example, a housing or ground of a mobile phone, a television, etc., and have relatively stable ground potential.

Figure 1:
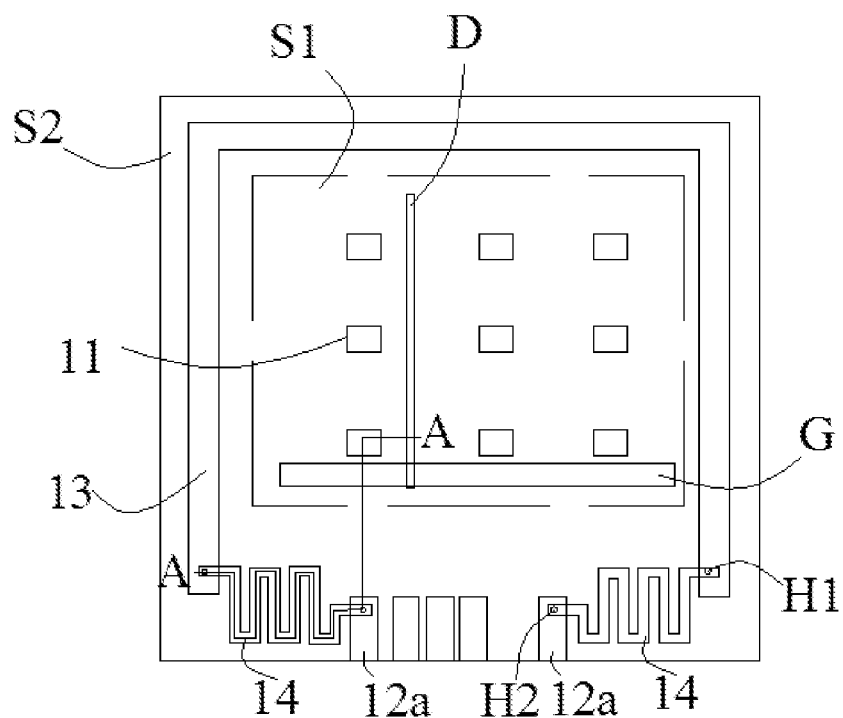
FIG. 1 is a top perspective view of a portion of a structure of a display substrate according to an embodiment of the present disclosure.
Figure 2:
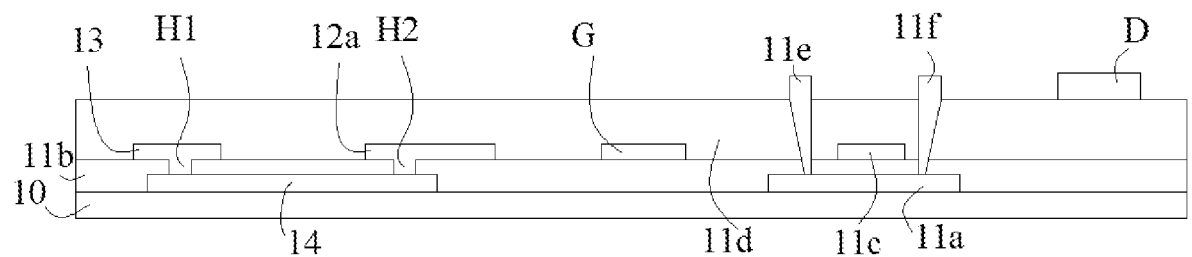
FIG. 2 is a cross-sectional view of the display substrate shown in FIG. 1 along line AA.

FIG. 1 is a top perspective view of a portion of a structure of a display substrate according to an embodiment of the present disclosure, and FIG. 2 is a cross-sectional view of the display substrate shown in FIG. 1 along line AA.

Referring to FIGS. 1 and 2, the display substrate according to the embodiment of the present disclosure includes a base substrate 10, and a plurality of transistors 11 disposed on the base substrate 10. The transistor 11 includes an active layer 11a. The base substrate 10 includes a display region S1 and a non-display region S2 surrounding outer boundaries of the display region S1, and the non-display region S2 is divided into a bonding region and a non-bonding region. The display substrate further includes a plurality of bonding pads, an orthographic projection of each of the bonding pads on the base substrate 10 is at least partially located in the bonding region, and the plurality of bonding pads include at least one ground bonding pad 12a. The display substrate further includes an anti-static wire 13, and at least one anti-static resistor 14 disposed at the same layer as the active layer 11a. A first terminal of the anti-static resistor 14 is electrically connected to the anti-static wire 13 through a first via hole H1, and a second terminal of the anti-static resistor 14 is electrically connected to the ground bonding pad 12a through a second via hole H2. Orthographic projections of the anti-static wire 13 and the anti-static resistor 14 on the base substrate 10 are located in the non-display region S2 and at least surround the boundaries of the display region S1 except for a boundary facing the bonding region.

One sub-pixel typically corresponds to one or more transistors 11. Sub-pixels may be arranged in an array. In the drawings, one transistor 11 represents a location of one sub-pixel. The transistor 11 may be a top gate type thin film transistor or a bottom gate type thin film transistor, which both are horizontal type thin film transistors or vertical type thin film transistors, which is not limited in the embodiment. In the following description, the transistor 11 is exemplified as the top gate type thin film transistor.

According to an embodiment of the present disclosure, the transistor 11, and a data line D and a gate line G connected to the transistor 11 are disposed in the display region S1, and other circuitries, for example, the anti-static wire 13, the anti-static resistor 14, etc., are disposed in the non-display region S2. The non-display region S2 refers to a portion of the display substrate located outside the outer boundaries of the display region S1. A boundary between the display region S1 and the non-display region S2 includes a boundary of a part of the sub-pixels. The boundary of the sub-pixels may be a boundary of pixel electrode in the sub-pixel, or a boundary of the transistor 11 located outermost in the sub-pixel, or the like. Regardless of how the boundary of the sub-pixel is defined, the display region S1 and the non-display region S2 of the display substrate have the same meanings as those commonly understood by those skilled in the art.

The bonding pads are disposed in a portion of the non-display region S2 of the display substrate. The bonding pads are used for bonding with a component such as a flexible circuit board through an anisotropic conductive adhesive (ACF) so as to receive various types of electrical signals from the flexible circuit board. For the display substrate with a rectangular shape, the bonding region is generally located in a region of the non-display region S2 located at one side of the display substrate. For the display substrate with a circular shape, the bonding region may be a region of the non-display region S2 corresponding to a circular segment of a periphery of the display substrate. The bonding pads include at least one ground bonding pad 12a which is used as a bonding pad for connection with the ground, such as a mobile phone housing, of a whole machine. The ground bonding pad 12a may also be eventually connected to the ground, which depends on a connection manner of a display device including the display substrate. The bonding pads may also include a bonding pad used for connection with a data voltage output terminal of a driving chip (not shown), a power bonding pad used for connection with a power voltage terminal of a main board (not shown), and the like, which will not be described herein.

The anti-static resistor 14 may be formed simultaneously in a step of forming the active layer 11a of the transistor 11. In the manufacturing process of the display substrate, the number of mask plates does not need to be increased. The anti-static resistor 14 is generally located in a different layer structure and has a different distance from the base substrate 10 from the anti-static wire 13 and the ground bonding pad 12a, so the first via hole H1 and the second via hole H2 are required to connect them together.

As can be seen from FIGS. 1 and 2, the anti-static wire 13 is connected with the ground of the whole machine through the anti-static resistor 14. The anti-static wire 13 and the anti-static resistor 14 surround most of the outer boundaries of the display region S1. When static electricity is accumulated on the housing, the anti-static resistor 14 can consume a certain amount of the static electricity, and prevent static charges from entering the display region S1. When the static electricity is accumulated on the display substrate, the static electricity can be dispersed to the ground along the anti-static wire 13 and through the anti-static resistor 14. The static charges will also be dissipated to some extent in this path.

According to an embodiment of the present disclosure, the display substrate further includes a plurality of signal lines, and the anti-static wire 13 and at least partial structure of at least part of the signal lines are disposed at the same layer.

The signal lines are, for example, a gate line G, a data line D, a ground line (not shown), a common electrode line (not shown), and the like. There are usually multiple gate lines G and each gate line G usually corresponds to one row of sub-pixels. Only one gate line G is shown in the drawing. There are also multiple data lines D and each data line D generally corresponds to one column of sub-pixels. Only one data line D is shown in the drawing. The correspondence between the gate line G and the sub-pixels and the correspondence between the data line D and the sub-pixels are not limited to the above. The ground line is connected to a ground potential, which is typically a potential of the housing of, for example, a mobile phone, a computer, etc. The common electrode line is used for providing a common electrode, and in a liquid crystal display, a voltage difference between a potential of the common electrode and a data voltage written into the sub-pixels through the data line D determines a rotation state of liquid crystal molecules, and further determines brightness of the sub-pixels.

When the display substrate is manufactured, the anti-static wire 13 may be manufactured while one of the signal lines is manufactured. As shown in FIG. 2, the anti-static wire 13 is disposed at the same layer as the gate line G and the gate electrode 11c. Those skilled in the art can also arrange the anti-static wire 13 in the same layer as the data line D.

Referring to FIG. 2, the transistor 11 further includes a gate insulating layer 11b covering the active layer 11a, a gate electrode 11c disposed on a side of the gate insulating layer 11b facing away from the base substrate 10, an interlayer dielectric layer 11d covering the gate electrode 11c, and a source electrode 11e and a drain electrode 11f disposed on a side of the interlayer dielectric layer 11d facing away from the base substrate 10. The source electrode 11e and the drain electrode 11f are connected to the active layer 11a through via holes penetrating through the interlayer dielectric layer 11d and the gate insulating layer 11b, respectively. The anti-static wire 13, at least a portion of the gate line G and the gate electrode 11c are disposed at the same layer. The first via hole H1 and the second via hole H2 penetrate through the gate insulating layer 11b.

According to an embodiment of the present disclosure, the gate electrode 11c and the data line D may be made of a metal material such as copper (Cu), aluminum (Al), molybdenum (Mo), titanium (Ti), chromium (Cr), tungsten (W), or the like, or may be made of an alloy including the above metal materials. The gate electrode 11c and the data line D may have a single-layer structure or a multi-layer structure, for example, a multi-layer structure formed of Mo, Al, Mo, a multi-layer structure formed of Ti, Cu, Ti, or a multi-layer structure formed of Mo, Ti, Cu.

According to an embodiment of the present disclosure, the gate insulating layer 11b and the interlayer dielectric layer 11d each may be made of silicon nitride or silicon oxide, respectively. The gate insulating layer 11b and the interlayer dielectric layer 11d each may have a single-layer structure or a multi-layer structure, for example, a multi-layer structure formed of silicon oxide and silicon nitride.

According to an embodiment of the present disclosure, referring to FIG. 1, the display substrate includes two anti-static resistors 14 and at least two ground bonding pads 12a. Two terminals of one anti-static resistor 14 are electrically connected to one end of the anti-static wire 13 and one ground bonding pad 12a, respectively, and two terminals of the other anti-static resistor 14 are electrically connected to the other end of the anti-static wire 13 and the other ground bonding pad 12a, respectively.

Figure 3:
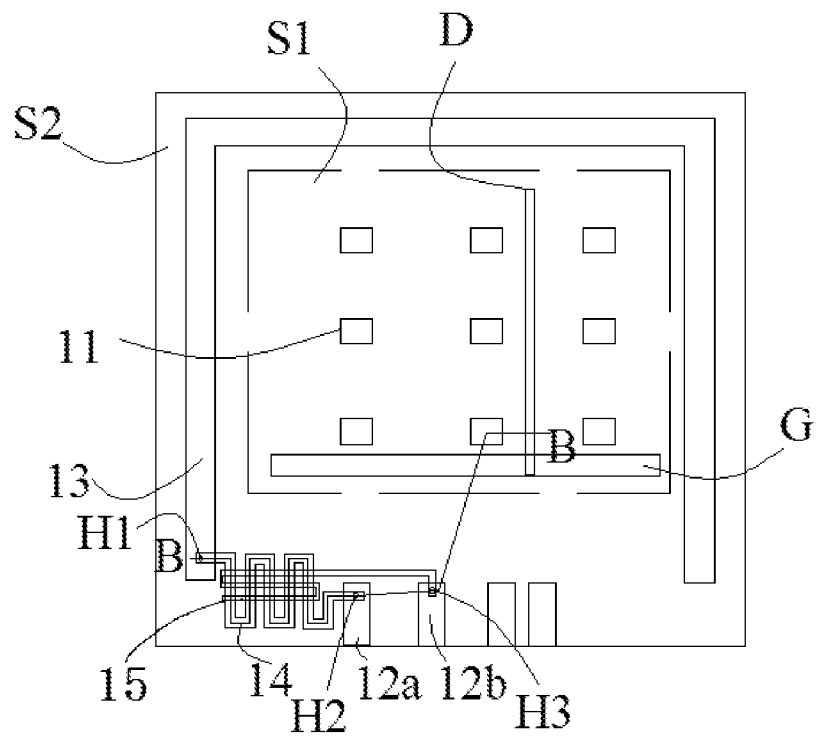
FIG. 3 is a top perspective view of a portion of a structure of a display substrate according to another embodiment of the present disclosure.

In the embodiment, both ends of the anti-static wire 13 are connected to the anti-static resistors 14, respectively. Static electricity is consumed at the both ends of the anti-static wire 13. Alternatively, limited by the space in the display substrate, only one end of the anti-static wire 13 may be connected to the anti-static resistor 14 as shown in FIG. 3. In this case, the end of the anti-static wire 13 which is not connected to the anti-static resistor 14 may or may not be connected to the ground bonding pad 12a. FIG. 3 shows a case where the end of the anti-static wire 13 which is not connected to the anti-static resistor 14 is not connected to the ground bonding pad 12a.

According to an embodiment of the present disclosure, the display region S1 has a rectangular shape, the orthographic projection of the anti-static wire 13 on the base substrate 10 faces three sides of the rectangular shape, and the anti-static resistor 14 faces a remaining side of the rectangular shape. This arrangement is to protect as many regions as possible of the outer boundaries of the display region S1.

According to an embodiment of the present disclosure, at least a portion of the orthographic projection of the anti-static resistor 14 on the base substrate 10 may have a square waveform shape. This is to increase a resistance of the anti-static resistor 14, but the anti-static resistor 14 is not limited to have the square waveform shape.

According to an embodiment of the present disclosure, patterns of the anti-static resistor 14 and the active layer 11a may be formed of polysilicon, and the anti-static resistor 14 is formed by doping the pattern of the anti-static resistor 14, i.e., the anti-static resistor 14 may be formed of doped polysilicon.

Figure 4:
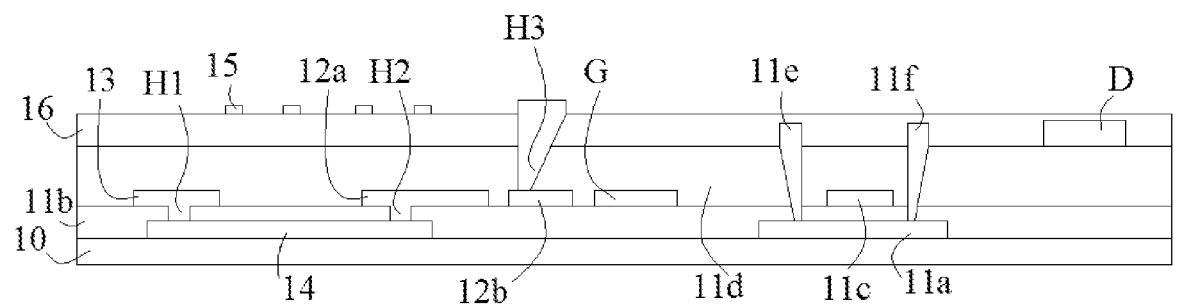
FIG. 4 is a cross-sectional view of the display substrate shown in FIG. 3 along line BB.

FIG. 3 is a top perspective view of a portion of a structure of a display substrate according to another embodiment of the present disclosure, and FIG. 4 is a cross-sectional view of the display substrate shown in FIG. 3 along line BB. Here, structures shown in FIGS. 3 and 4 which are same as those shown in FIGS. 1 and 2 will not be described repeatedly.

Referring to FIGS. 3 and 4, the display substrate may further include an anti-static electrode 15, an orthographic projection of the anti-static electrode 15 on the base substrate 10 overlaps the orthographic projection of the anti-static resistor 14 on the base substrate 10, and the anti-static electrode 15 and the anti-static resistor 14 are separated from each other through an insulating layer, the plurality of bonding pads further include a common electrode bonding pad 12b, and the anti-static electrode 15 and the common electrode bonding pad 12b are electrically connected through a third via hole H3.

By providing the anti-static electrode 15 connected to the common electrode bonding pad 12b, a capacitor can be formed at an intersection of the anti-static electrode 15 and the anti-static resistor 14. Since one terminal of the capacitor is connected to the ground and the other terminal of the capacitor is connected to the common electrode bonding pad 12b (that is, connected to a common voltage), potentials at both terminals are relatively stable. Therefore, the capacitance effect can better absorb a part of the static charges, and further reduce a damage to the display substrate. A structure in which a resistor and a capacitor are connected in parallel is formed between the anti-static wire 13 and the bonding pads, which can enhance blocking of external static electricity.

According to an embodiment of the present disclosure, at least a portion of the orthographic projection of the anti-static electrode 15 on the base substrate 10 may have a square waveform shape. The orthographic projection of the anti-static electrode 15 on the base substrate 10 may have other shape such as a straight line shape, a curved line shape or the like.

According to an embodiment of the present disclosure, an orientation of the square waveform shape of the anti-static electrode 15 is different from an orientation of the square waveform shape of the anti-static resistor 14. In such manner, a plurality of resistor segments and a plurality of capacitors can be alternately formed. For example, as shown in FIG. 3, from the current view, the square wave shape of the anti-static electrode 15 is horizontal, and the square wave shape of the anti-static resistor 14 is vertical.

According to an embodiment of the present disclosure, referring to FIG. 4, the transistor 11 includes the gate insulating layer 11b covering the active layer 11a, the gate electrode 11c disposed on the side of the gate insulating layer 11b facing away from the base substrate 10, the interlayer dielectric layer 11d covering the gate electrode 11c, and the source electrode 11e and the drain electrode 11f disposed on the side of the interlayer dielectric layer 11d facing away from the base substrate 10. The source electrode 11e and the drain electrode 11f are connected to the active layer 11a through the via holes penetrating through the interlayer dielectric layer 11d and the gate insulating layer 11b, respectively. The display substrate further includes a passivation layer 16 covering the source electrode 11e and the drain electrode 11f, and a pixel electrode (not shown) disposed on a side of the passivation layer 16 facing away from the base substrate 10 and/or a common electrode (not shown) disposed on the side of the passivation layer 16 facing away from the base substrate 10. The pixel electrode and the anti-static electrode 15 are disposed at the same layer, or the common electrode and the anti-static electrode 15 are disposed at the same layer, or the pixel electrode, the common electrode and the anti-static electrode 15 are disposed at the same layer. The third via hole H3 penetrates through the passivation layer 16 and the interlayer dielectric layer 11d.

After the transistor 11 is manufactured and the passivation layer 16 is provided, and a same material layer is processed by using a mask, so that the pixel electrode and the anti-static electrode 15 are simultaneously formed on the passivation layer 16, or the common electrode and the anti-static electrode 15 are simultaneously formed on the passivation layer 16. In some cases, the pixel electrode, the common electrode and the anti-static electrode 15 may be at the same layer. The third via hole H3 penetrates through the passivation layer 16 and the interlayer dielectric layer 11d to cause the anti-static electrode 15 to connect with the common electrode bonding pad 12b under the interlayer dielectric layer 11d.

According to an embodiment of the present disclosure, the passivation layer 16 may be formed of silicon nitride or silicon oxide, and may have a single-layer structure or a multi-layer structure, for example, a multi-layer structure formed of silicon oxide and silicon nitride.

Each of the bonding pads is generally formed on the side of the gate insulating layer 11b facing away from the base substrate 10, but the present disclosure is not limited thereto.

According to an embodiment of the present disclosure, the anti-static electrode 15 may be formed of Indium Tin Oxide (ITO).

The present disclosure also provides a display device including the display substrate as described above.

The display device may be any product or component with a display function, such as a liquid crystal display panel, an organic light emitting diode (OLED) display panel, an electronic paper, a mobile phone, a tablet computer, a television, a display, a notebook computer, a digital photo frame, a navigator or the like.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the disclosure.

The invention claimed is:

1. A display substrate, comprising:
   a base substrate;
   a transistor, an anti-static wire, a first anti-static resistor, and a first ground bonding pad on the base substrate; and
   an anti-static electrode and a common electrode bonding pad which is configured to receive a common voltage,
   wherein a first terminal of the first anti-static resistor is electrically connected to a first end of the anti-static wire, and a second terminal of the first anti-static resistor is electrically connected to the first ground bonding pad,
   the first anti-static resistor is at a different layer from a layer at which the anti-static wire is located and a layer at which the first ground bonding pad is located, and is at a same layer as an active layer of the transistor,
   an orthographic projection of the anti-static electrode on the base substrate overlaps an orthographic projection of the first anti-static resistor on the base substrate, the anti-static electrode and the first anti-static resistor are insulated and spaced apart from each other in a thickness direction of the display substrate, and the anti-static electrode is electrically connected to the common electrode bonding pad.

2. The display substrate of claim 1, further comprising: a second anti-static resistor and a second ground bonding pad, a first terminal of the second anti-static resistor is electrically connected to a second end of the anti-static wire, and a second terminal of the second anti-static resistor is electrically connected to the second ground bonding pad.

3. The display substrate of claim 1, wherein the display substrate is divided into a display region and a non-display region surrounding boundaries of the display region, the display region comprises the transistor, the non-display region comprises the anti-static wire, the first anti-static resistor, the anti-static electrode and a plurality of bonding pads, and the plurality of bonding pads at least comprise the first ground bonding pad and the common electrode bonding pad.

4. The display substrate of claim 3, wherein the anti-static wire surrounds the boundaries of the display region except for a boundary facing a region in which the plurality of bonding pads are located.

5. The display substrate of claim 3, wherein the display region has a rectangular shape, the anti-static wire is disposed along three sides of the rectangular shape, and the first anti-static resistor is disposed along a remaining side of the rectangular shape.

6. The display substrate of claim 1, further comprising a signal line, wherein the anti-static wire is at a same layer as at least a portion of the signal line.

7. The display substrate of claim 6, wherein the signal line comprises at least one of a gate line, a data line, a ground line and a common electrode line.

8. The display substrate of claim 1, wherein the transistor comprises the active layer, a gate insulating layer covering the active layer, a gate electrode on a side of the gate insulating layer facing away from the base substrate, an interlayer dielectric layer covering the gate electrode, and a source electrode and a drain electrode on a side of the interlayer dielectric layer facing away from the base substrate, and each of the source electrode and the drain electrode is connected to the active layer through a via hole penetrating through the interlayer dielectric layer and the gate insulating layer.

9. The display substrate of claim 8, wherein the first anti-static resistor is between the base substrate and the gate insulating layer, the first terminal of the first anti-static resistor is electrically connected to the first end of the anti-static wire through a first via hole penetrating through the gate insulating layer, and the second terminal of the first anti-static resistor is electrically connected to the first ground bonding pad through a second via hole penetrating through the gate insulating layer.

10. The display substrate of claim 8, wherein the transistor further comprises a passivation layer covering the source electrode and the drain electrode, and at least one of a pixel electrode on a side of the passivation layer facing away from the base substrate and a common electrode on the side of the passivation layer facing away from the base substrate.

11. The display substrate of claim 10, wherein the anti-static electrode is on the passivation layer, and is electrically connected to the common electrode bonding pad through a third via hole penetrating through the passivation layer and the interlayer dielectric layer.

12. The display substrate of claim 11, wherein the anti-static electrode is at a same layer as at least one of the pixel electrode and the common electrode.

13. The display substrate of claim 1, wherein at least a portion of the orthographic projection of the first anti-static resistor on the base substrate has a first square waveform shape, at least a portion of the orthographic projection of the anti-static electrode on the base substrate has a second square waveform shape, and the first square waveform shape has an orientation which is different from an orientation of the second square waveform shape.

14. The display substrate of claim 1, wherein the first anti-static resistor is formed of doped polysilicon.

15. The display substrate of claim 1, wherein the anti-static electrode is formed of indium tin oxide.

16. A display device, comprising the display substrate of claim 1.

* * * * *